United States Patent [19]

Cline et al.

[11] 3,956,026

[45] May 11, 1976

[54] MAKING A DEEP DIODE VARACTOR BY THERMAL MIGRATION

[75] Inventors: Harvey E. Cline; Thomas R. Anthony, both of Schenectady, N.Y.

[73] Assignee: General Electric Company, Schenectady, N.Y.

[22] Filed: Nov. 29, 1974

[21] Appl. No.: 528,235

Related U.S. Application Data

[62] Division of Ser. No. 411,149, Oct. 30, 1973.

[52] U.S. Cl. ............................. 148/1.5; 148/171; 148/172; 148/177; 148/179; 252/62.3 GA; 252/62.3 E; 357/76

[51] Int. Cl.² ...................... H01L 7/34; H01L 7/00

[58] Field of Search ............ 148/1.5, 171, 172, 173, 148/177, 178, 179, 188; 252/62.3 GA, 62.3 E; 75/65 ZM; 357/76

[56] References Cited

UNITED STATES PATENTS

| 2,813,048 | 11/1957 | Pfann ............................. 75/65 ZM |
| 3,205,101 | 9/1965 | Mlavsky et al. .................. 148/1.5 X |
| 3,360,851 | 1/1968 | Kahng et al. .................... 148/188 X |

*Primary Examiner*—G. Ozaki
*Attorney, Agent, or Firm*—Donald M. Winegar; Joseph T. Cohen; Jerome C. Squillaro

[57] ABSTRACT

A varactor has a lamellar structure of a plurality of abutting regions of alternate and opposite type conductivity. The structure is produced by thermal gradient zone melting processing.

23 Claims, 6 Drawing Figures

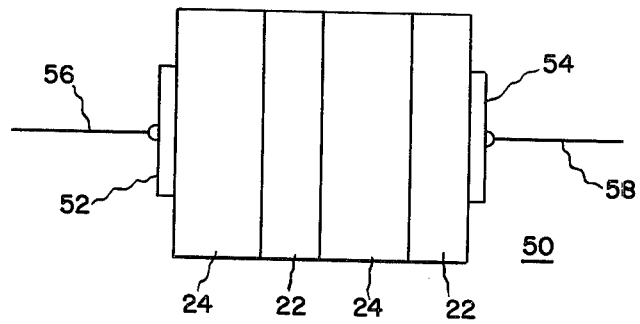
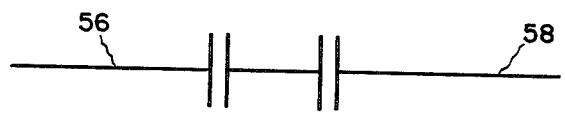
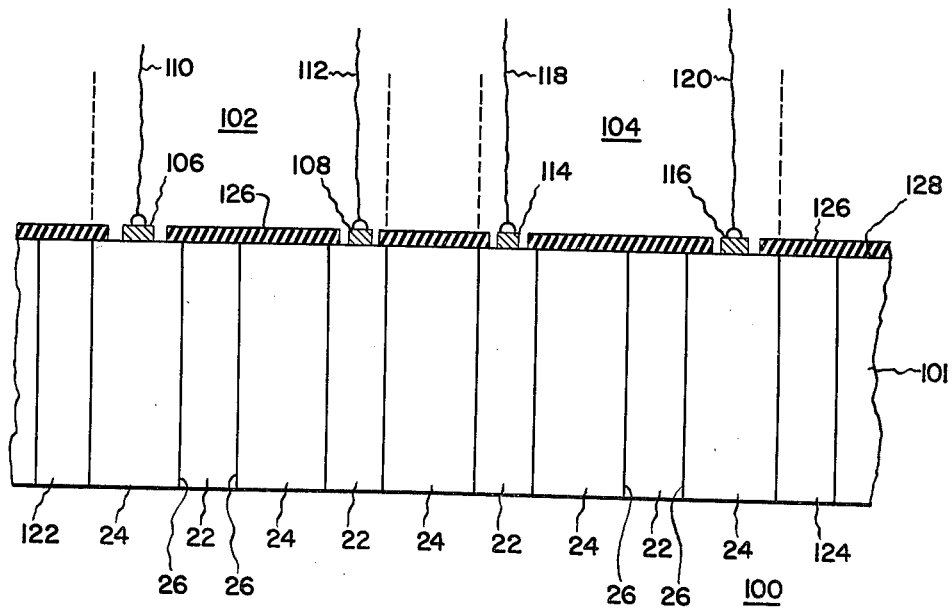

3,956,026

MAKING A DEEP DIODE VARACTOR BY THERMAL MIGRATION

This is a division of application Ser. No. 411,149, filed Oct. 30, 1973.

BACKGROUND OF THE INVENTION

1. Field of the Invention

This invention relates to semiconductor varactors and a process for producing the same.

2. Description of the Prior Art

Heretofore, varactors for semiconductor circuitry are formed by alloying, diffusion and epitaxial growth techniques. These techniques of processing inherently limit the physical characteristics and physical dimensions of the varactor manufactured thereby.

An object of this invention is to provide a new and improved semiconductor varactor which overcomes the deficiencies of the prior art devices.

Another object of this invention is to provide a new and improved semiconductor varactor having a lamellar structure and wherein selected regions of the device are formed from recrystallized material of the material of the substrate.

A further object of this invention is to provide a new and improved process for making a semiconductor varactor.

Other objects of this invention will, in part, be obvious and will, in part, appear hereinafter.

BRIEF DESCRIPTION OF THE INVENTION

In accordance with the teachings of this invention, there is provided a semiconductor varactor comprising a body of semiconductor material having a first type conductivity, a selective resistivity, and two major opposed surfaces. The body has a lamellar structure of a plurality of integral pairs of first and second planar regions. Each of the first planar regions has a first type conductivity, a selective resistivity, and at least one surface area coextensive with the same major surface of the body. Each of the second planar regions has a second and opposite type conductivity, and a selective resistivity. The material of each planar region of second type conductivity is recrystallized material of the body having solid solubility of metal therein to impart the conductivity and resistivity thereto. Each second planar region has at least one surface area coextensive with the same major surface of the body as the first planar regions. A P-N junction is formed by the contiguous surfaces of each pair of mutually adjacent planar regions of opposite type conductivity. Electrical means are affixed to at least one selected region of first type conductivity and at least one selected region of second type conductivity for the reverse biasing of at least one P-N junction disposed between the two selected regions of opposite type conductivity whereby with the application of a varying amount of potential applied to the varactor via the electrical means, the capacitance of the varactor is varied accordingly.

DESCRIPTION OF THE DRAWINGS

FIG. 4 is an elevation view, in cross-section of a semiconductor varactor made in accordance with the teachings of this invention;

FIG. 5 is an equivalent electrical circuit of the varactor of FIG. 4, and

FIG. 6 is an elevation view, in cross-section of a portion of an integrated circuit embodying the varactor of this invention.

DESCRIPTION OF THE INVENTION

Figure 1:
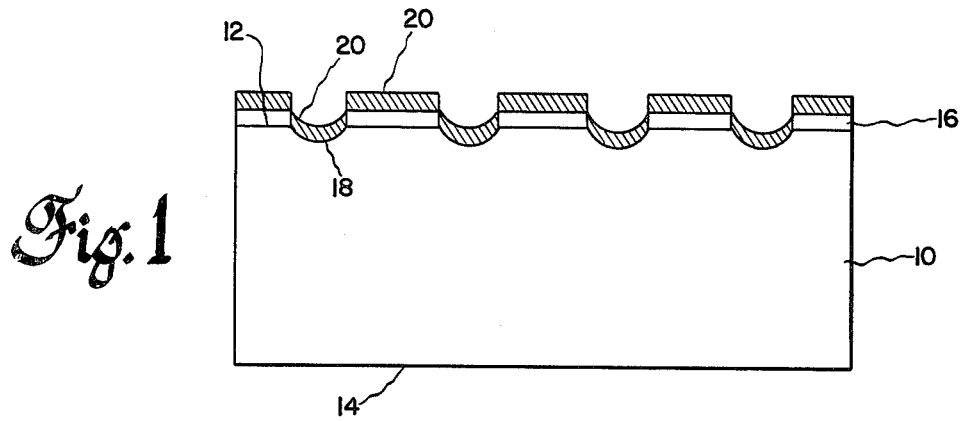
FIGS. 1 through 3 are elevation views, in cross-section, of a body of semiconductor material processed in accordance with the teachings of this invention.

With reference to FIG. 1, there is shown a body 10 semiconductor material having a selected resistivity and a first type conductivity. The body 10 has two opposed major surfaces 12 and 14 which are the top and bottom surfaces respectively thereof. The semiconductor material comprising the body 10 may be silicon, germanium, silicon carbide, gallium arsenide, a compound of a Group II element and a Group VI element, and a compound of a Group III element and a Group V element.

The body 10 is mechanically polished, chemically etched to remove any damaged surfaces, rinsed in deionized water and dried in air. An acid resistant mask 16 is disposed on the surface 12 of the body 10. Preferably the mask is of silicon oxide which is either thermally grown or vapor deposited on the surface 12 by any of the methods well known to those skilled in the art. Employing well known photolithographical techniques, a photoresist, such, for example, as Kodak Metal Etch Resist, is disposed on the surface of the silicon oxide layer 16. The resist is dried by baking at a temperature of about 80°C. A suitable mask of spaced lines of a predetermined thickness and spaced a predetermined distance apart, is disposed on the layer of photoresist and exposed to ultraviolet light. After exposure, the layer of photoresist is washed in xylene, to open windows in the mask where the lines are desired so as to be able to selectively etch the silicon oxide layer 16 exposed in the windows.

Selective etching of the layer 16 of silicon oxide is accomplished with a buffered hydrofluoric acid solution ($NH_4F$—HF). The etching is continued until a second set of windows corresponding to the windows of the photoresist mask are opened in the layer 16 of silicon oxide to expose selective portions of the surface 12 of the body 10 of silicon. The processed body 10 is rinsed in deionized water and dried. The remainder of the photoresist mask is removed by immersion in concentrated sulphuric acid at 180°C or immersion in a solution of 1 part of hydrogen peroxide and 1 part of concentrated sulphuric acid immediately after mixing.

Selective etching of the exposed surface areas of body 10 is accomplished with a mixed acid solution. The mixed acid solution is 10 parts by volume nitric acid 70%, 4 parts by volume acetic acid, 100%, and 1 part by volume hydrofluoric acid 48%. At a temperature of from 20°C to 30°C, the mixed acid solution selectively etches the silicon of the body 10 at a rate of approximately 5 microns per minute. A trough 18 is etched in the surface 12 of the body 10 beneath each window of the oxide layer 16. The selective etching is continued until the depth of the trough 18 is approximately equal to the width of the window in the silicon oxide layer 16. However, it has been discovered, that the trough 18 should not be greater than approximately 100 microns in depth because undercutting of the silicon oxide layer 16 will occur. Undercutting of the layer 16 of silicon oxide has a detrimental effect on the width of the device to be migrated through the body 10. Etching for approximately 5 minutes at a temperature of 25°C will result in a trough 18 of from 25 to 30 microns in depth for a window width of 10 to 500 microns. The etched body 10 is rinsed in distilled water and blown dry. Preferably, a gas such, for example, as, freon, argon and the like is suitable for drying the processed body 10.

The processed body 10 is disposed in a metal evaporation chamber. A metal layer 20 is deposited on the remaining portions of the layer 16 of silicon oxide and on the exposed silicon in the troughs 18. The metal in the troughs 18 are the metal "wires" to be migrated through the body 10. The metal of the layer 20 comprises a material, either substantially pure in itself or suitably doped by one or more materials to impart a second and opposite type conductivity to the material of the body 10 through which it migrates. The thickness of the layer 20 is approximately equal to the depth of the trough 18. Therefore, if the trough 18 is 20 microns deep, the layer 20 is approximately 20 microns in thickness. A suitable material for the metal layer 20 is aluminum to obtain P-type regions in N-type silicon semiconductor material. Prior to migrating the metal wires in the troughs 18 through the body of silicon 10, the excess metal of the layer 20 is removed from the silicon oxide layer 16 by such suitable means as grinding away the excess metal with a 600 grit carbide paper.

It has been discovered that the vapor deposition of the layer 20 of aluminum metal should be performed at a pressure of approximately $1 \times 10^{-5}$ torr but not greater than $5 \times 10^{-5}$ torr. When the pressure is greater than $3 \times 10^{-5}$ torr we have found that in the case of aluminum metal deposited in the troughs 18, the aluminum does not penetrate into the silicon and migrate through the body 10. It is believed that the layer of aluminum is saturated with oxygen and prevents good wetting of the contiguous surfaces of silicon. The initial melt of aluminum and silicon required for migration is not obtained because of the inability of aluminum atoms to diffuse into the silicon interface. In a like manner, aluminum deposited by sputtering is not desirable as the aluminum appears to be saturated with oxygen from the process. The preferred methods of depositing aluminum on the silicon body 10 are by the electron beam method and the like wherein little if any oxygen can be trapped in the aluminum.

The processed body 10 is placed in a migration apparatus, not shown, and the metal wires in the troughs 18 are migrated through the body 10 by a thermal gradient zone melting process. A thermal gradient of approximately 50°C per centimeter between the bottom surface 14, which is the hot face, and the surface 12, which is the cold face, has been discovered to be appropriate for an average temperature of the body 10 of from 700°C to 1350°C. The process is practiced for a sufficient length of time to migrate all the metal wires through the body 10. For example, for aluminum wires of 20 microns thickness, a thermal gradient of 50°C per centimeter, a temperature of the body 10 of 1100°C, a pressure of $1 \times 10^{-5}$ torr, a furnace time of less than 12 hours is required to migrate the wires through a silicon body 10 of 1 centimeter thickness.

The temperature gradient zone melting process and apparatus is not a part of this invention. For a more thorough understanding of the temperature gradient zone melting process employed in this invention and for a more thorough description of the apparatus employed for the process, one is directed to our following copending applications filed concurrently with this patent application and assigned to the same assignee of this invention: Method of Making Deep Diode Devices, U.S. Pat. No. 3,901,736; Deep Diode Device Production and Method, Ser. No. 411,021, now U.S. Pat. No. 3,910,801; Deep Diode Devices and Method and Apparatus, Ser. No. 411,001, now abandoned in favor of Ser. No. 552,154; High Velocity Thermomigration Method of Making Deep Diodes, Ser. No. U.S. Pat. No. 3,898,106; Deep Diode Device Having Dislocation-Free P-N Junctions and Method, U.S. Pat. No. 3,902,925; and The Stabilized Droplet Method of Making Deep Diodes Having Uniform Electrical Properties, U.S. Pat. No. 3,899,361.

Figure 2:
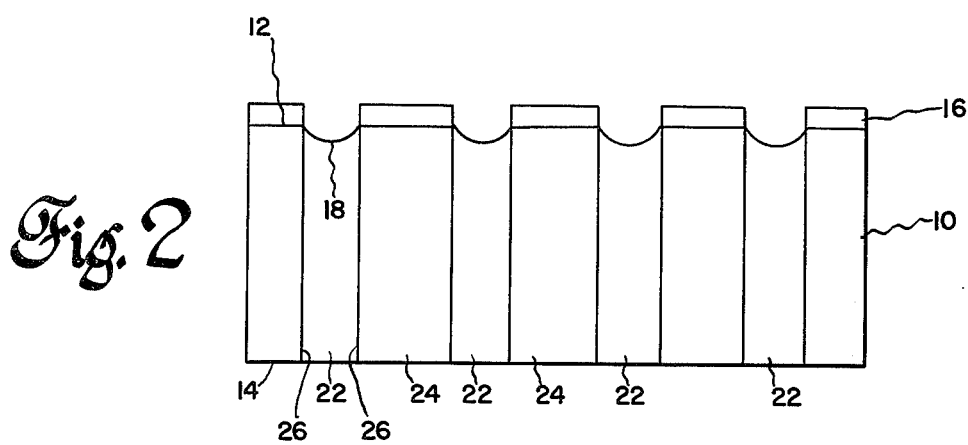

Upon completion of the temperature gradient zone melting process the excess metal of the thermomigrated metal wires is removed from the surface 14 preferably by selective etching. The surfaces 12 and 14 are selectively etched and polished and the resulting processed body 10 is as shown in FIG. 2. The thermal migration of the metal wires in the troughs 18 through the body 10 produces a body 10 having a plurality of first spaced regions 22 of a second and opposite type conductivity than the body 10. Each region 22 is recrystallized material of the body 10 having solid solubility of the metal therein of a concentration sufficient to obtain the desired conductivity. The region 22 has a substantially constant uniform level of impurity concentration throughout the entire planar region as the temperature gradient in the body and the slope of the solid solubility of metals employed is such as not to appreciably affect material composition. The thickness of the region 22 is substantially constant for the entire region. The peripheral surface of each planar region 22 comprises in part the top surface 12, the bottom surface 14 and the peripheral side surface of the body 10.

Additionally, the body 10 is divided into a plurality of spaced regions 24 having the same, or first, type conductivity as the body 10. A P-N junction 26 is formed by the contiguous surfaces of each pair of mutually adjacent regions 22 and 24 of opposite type conductivity. The P-N junction 26, as formed, is very abrupt and distinct resulting in a step junction. Each P-N junction 26 is approximately 18 microns in thickness. At a process temperature of 900°C, the P-N junction 26 profile is reduced to approximately 0.3 microns.

Figure 3:
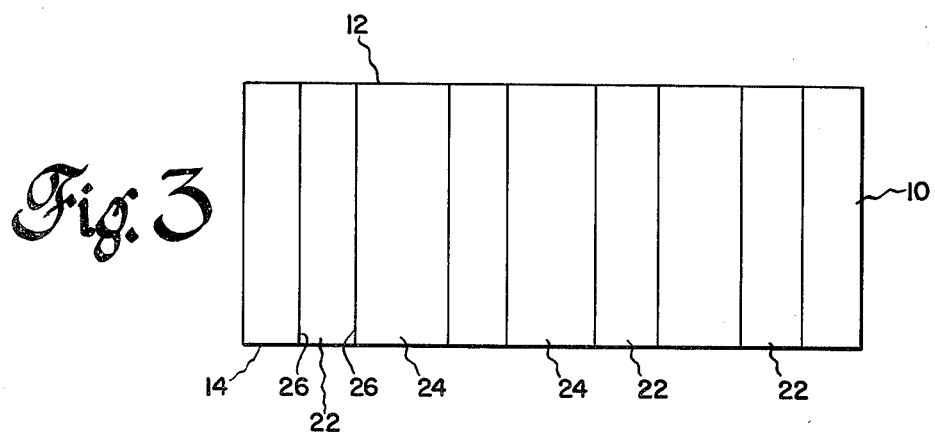

The resulting structure is one large lamellar body of a plurality of planar regions of alternate type conductivity as shown in FIG. 3. The structure may also be divided into a plurality of chips having a similar configuration.

Referring now to FIG. 4, there is shown a semiconductor varactor 50 embodying a portion of the processed body 10 of FIG. 3. The varactor 50 has a lamellar structure of four regions 24, 22, 24 and 22 of opposite type conductivity. An ohmic electrical contact 52 is affixed to one of the regions 24 and an ohmic electrical contact 54 is affixed to one of the regions 22. The arrangement as shown provides three P-N junctions 26 for back biasing to provide a functional varactor 50. Electrical leads 56 and 58 connect to respective contacts 52 and 54 to provide a means for the back biasing of the P-N junctions 26. The equivalent electrical circuit is as shown in FIG. 5.

The planar regions 22 may have a resistivity different from that of the body 10. This is achieved by temperature gradient zone melting process wherein the material of the metal layer 20 is suitable for producing regions 24 of recrystallized material of the body with solid solubility of the metal 20 to impart the same N- type conductivity of the body 10 but of a different desired resistivity.

As fabricated, the varactor of this invention is superior to the prior art devices in that the materials of the regions 22 and 24 and the P-N junctions 26 have substantially ideal physical characteristics for the materials employed. The temperature gradient zone melting process besides forming the desired planar regions also refines the regions and produces recrystallized material of superior physical properties and qualities than the initial material of the body 10. A varactor having a P-N junction area of 100 square centimeters fabricated from 100 regions of 10 ohm-centimeter N-type silicon and 100 regions of P-type conductivity aluminum doped regions of a resistivity of $8 \times 10^{-3}$ ohm-centimeter, the capacitance varies from $7 \times 10^5$ picofarads to $5 \times 10^4$ picofarads for an applied voltage of from 1 volt to 600 volts.

The lamellar structured varactor of this invention is suitable for use in integrated circuits. With reference to FIG. 6 a portion of an integrated circuit 100 comprises a body 101 of semiconductor material having a first type conductivity and a selective resistivity. For example, the body 101 may be of silicon of N-type conductivity and 10 ohms-centimeter resistivity and embodies the processed body 10 of FIG. 4. The processed body 10 is fabricated as two varactors 102 and 104. Ohmic electrical contacts 106 and 108 are affixed to selective ones of the regions 24 and 22. An electrical lead 110 is affixed to contact 106 and an electrical lead 112 is affixed to contact 108 to connect the varactor 102 into suitable electrical circuitry. Similarly, ohmic-electrical contacts 114 and 116 and electrical leads 118 and 120 connect the varactor into external electrical circuitry.

Planar region 24 functions as an electrical isolation region to electrically isolate the varactors 102 and 104 from each other. Additionally, planar regions 122 and 124 of P-type conductivity are formed by the migration of metal wires of suitable metal in the body 101 to form electrical isolation regions to electrically isolate the varactors 102 and 104 from the remainder of the body 101 and semiconductor devices embodied therein. A layer 126 of electrically insulating material such, for example, as silicon oxide, silicon nitride, aluminum nitride and the like is disposed on a surface 128 with which selective surface areas of the planar regions of the varactors 102 and 104 are coextensive.

One recognizes that the various combinations of varactors embodying a lamellar structure of the invention is innumerable. The electrical circuit combinations embodying such varactors is numerous. The body 101 may be of N-type or P-type material as the initial starting material for an integrated circuit 100.

A distinct advantage of the varactor of this invention is that the required one or more varactors may be fabricated in an integrated circuit either before or after other devices are fabricated. Preferably, the varactors may be fabricated in the substrate of the integrated circuit after all the other devices are fabricated and prior to fabricating electrical connections. The temperature gradient zone melting process enables fast fabrication times which has insignificant affect on the previously fabricated devices.

The invention has been described relative to practicing thermal gradient zone melting in a negative atmosphere. However, it has been discovered that when the body of semiconductor material is a thin wafer of the order of 10 mil thickness, the thermal gradient zone melting process may be practiced in an inert gaseous atmosphere of hydrogen, helium, argon and the like in a furnace having a positive atmosphere.

The migration of metal wires is preferably practiced in accordance with the planar orientations, migration directions, stable wire directions and stable wire sizes of Table.

Table

| Wafer Plane | Migration Direction | | Stable Wire Directions | Stable Wire Sizes |
|---|---|---|---|---|
| (100) | < 100 > | | < 011 >* | < 100 microns |
| | | | < 0$\bar{1}$1 >* | < 100 microns |
| (110) | < 110 > | | < 1$\bar{1}$0 >* | < 150 microns |
| (111) | < 111 > | (a) | < 01$\bar{1}$ > | |
| | | | < ,10$\bar{1}$ > | < 500 microns |
| | | | < 1$\bar{1}$0 > | |
| | | (b) | < 11$\bar{2}$ >* | |
| | | | < $\bar{2}$11 >* | < 500 microns |
| | | | < 1$\bar{2}$1 >* | |
| | | (c) | Any other Direction in (111) plane* | 500 microns |

*The stability of the migrating wire is sensitive to the alignment of the thermal gradient with the < 100 >, < 110 > and < 111 > axis, respectively.
†Group a is more stable than group b which is more stable than group c.

We claim as our invention:

1. A process for making a semiconductor device comprising the process steps of:
    a. selecting a body of single crystal semiconductor material having
        1. two major opposed surfaces comprising, respectively, the top and bottom surfaces thereof,
        2. a selected level of resistivity,
        3. a selected type conductivity, and
        4. a preferred planar crystal structure orientation of at least one of the major opposed surfaces, the planar crystal structure orientation being one selected from the group consisting of (111), (100) and (110);
    b. orienting the body so that the vertical axis of the body is substantially aligned with a first axis of the crystal structure which is substantially perpendicular to the at least one major opposed surface having the preferred planar crystal structure orientation;
    c. disposing at least one metal wire of a selected metal composition on the surface having a preferred planar orientation, each metal wire having a preferred stable wire direction which is dependent on the planar orientation of the major surface;
    d. heating the body and the at least one metal wire to a temperature sufficient to transform the metal wire into a melt of metal-rich semiconductor material on the major surface;
    e. establishing a thermal gradient substantially parallel to the vertical axis of the body and the first axis of the crystal body;
    f. thermal migrating the at least one melt of metal wire of selective metal through the body in the direction of the higher temperature of the thermal gradient from the one major surface to, and terminating in, the other of the two major opposed surfaces to form at least one region of recrystallized material of the body having solid solubility of the selective metal therein and a second and opposite type conductivity than the body and thereby forming a P-N junction at the contiguous surfaces of the at least one region and the body;
    g. affixing a first ohmic electrical contact to one of the regions of recrystallized semiconductor material of the body, and h. affixing a second ohmic electrical contact to a selective portion of the original material of the body, the first and second contact arrangements being such as to cause the processed body to function as a varactor when voltage is applied across the two ohmic electrical contacts.

2. The process of claim 1 including practicing the process step prior to the depositing of the at least one metal wire on the major surface of
  selectively etching a selective portion of the major surface of the body to form a depression therein into which the metal wire is deposited.

3. The process of claim 2 wherein
  the metal is vapor deposited.

4. The process of claim 2 wherein
  the major surfaces have a preferred planar crystal orientation of (111), and
  the axis of the body is oriented in a crystal axis direction of <111>.

5. The process of claim 4 wherein
  the material of the body is one selected from the group consisting of silicon, silicon carbide, germanium and gallium arsenide.

6. The process of claim 5 wherein
  the material of the body is silicon of N-type conductivity, and
  the material of which has solid solubility in the recrystallized silicon is aluminum.

7. The process of claim 6 wherein
  each wire of selective metal has a preferred crystal direction selected from the group consisting of <01$\bar{1}$>, <10$\bar{1}$> and <1$\bar{1}$0>.

8. The process of claim 6 wherein
  each mass of selective metal has a preferred crystal direction selected from the group consisting of <11$\bar{2}$>, <$\bar{2}$11> and <1$\bar{2}$1>.

9. The process of claim 5 wherein
  each wire of selective metal has a preferred crystal direction selected from the group consisting of <01$\bar{1}$>, <10$\bar{1}$> and <1$\bar{1}$0>.

10. The process of claim 5 wherein
  each mass of selective metal has a preferred crystal direction selected from the group consisting of <11$\bar{2}$>, <$\bar{2}$11> and <1$\bar{2}$1>.

11. The process of claim 4 wherein
  each wire of selective metal has a preferred crystal direction selected from the group consisting of <01$\bar{1}$>, <10$\bar{1}$> and <1$\bar{1}$0>.

12. The process of claim 4 wherein
  each mass of selective metal has a preferred crystal direction selected from the group consisting of <11$\bar{2}$>, <$\bar{2}$11> and <1$\bar{2}$1>.

13. The process of claim 2 wherein
  the opposed major surfaces have a preferred planar crystal orientation of (100);
  each wire of selective metal has a preferred crystal direction selected from the group consisting of <011> and <0$\bar{1}$1>, and wherein
  the axis of the body is oriented in a crystalline axis direction of <100>.

14. The process of claim 13 wherein
  the material of the body is one selected from the group consisting of silicon, silicon carbide, germanium and gallium arsenide.

15. The process of claim 14 wherein
  the material of the body is silicon of N-type conductivity, and
  the material of which has solid solubility in the recrystallized silicon is aluminum.

16. The process of claim 13 wherein each metal wire has a width of less than 100 microns.

17. The process of claim 2 wherein
  at least the top surface has a preferred planar crystal orientation of (110);
  each wire of selective metal has a preferred crystal direction of <110>.

18. The process of claim 17 wherein
  the material of the body is one selected from the group consisting of silicon, silicon carbide, germanium and gallium arsenide.

19. The process of claim 18 wherein
  the material of the body is silicon of N-type conductivity, and
  the material of which has solid solubility in the recrystallized silicon is aluminum.

20. The process of claim 17 wherein the metal wire has a width of less than 150 microns.

21. The process of claim 2 wherein each metal wire has a width of less than 500 microns.

22. The process of claim 1 wherein
  the process is practiced by disposing a plurality of spaced metal wires on the surface of preferred planar orientation, migrating the plurality of metal wires through the body to form a varactor having a lamellar structure of alternate regions of first conductivity and second and opposite type conductivity.

23. The process of claim 22 wherein
  the material of the body is N-type semiconductor material;
  the level of resistivity of the body and the regions of first type conductivity is 10 ohm-centimeter,
  the metal of the wire migrated is aluminum, and
  the material of each region of second type conductivity has aluminum in solid solubility therein and a level of resistivity of $8 \times 10^{-3}$ ohm-centimeter.

* * * * *